(12) United States Patent
Hode et al.

(10) Patent No.: US 8,514,116 B2
(45) Date of Patent: Aug. 20, 2013

(54) METHOD FOR IMPROVING THE RESOLUTION AND FOR CORRECTING DISTORTIONS IN A SIGMA-DELTA MODULATOR, AND SIGMA-DELTA MODULATOR IMPLEMENTING SAID METHOD

(75) Inventors: Jean-Michel Hode, St Cloud (FR); Leila Kamoun, Nanterre (FR)

(73) Assignee: Thales, Neuilly sur Seine (FR)

( * ) Notice: Subject to any disclaimer, the term of this patent is extended or adjusted under 35 U.S.C. 154(b) by 28 days.

(21) Appl. No.: 13/127,039

(22) PCT Filed: Oct. 29, 2009

(86) PCT No.: PCT/EP2009/064324
§ 371 (c)(1),
(2), (4) Date: Jul. 11, 2011

(87) PCT Pub. No.: WO2010/049507
PCT Pub. Date: May 6, 2010

(65) Prior Publication Data
US 2011/0309959 A1 Dec. 22, 2011

(30) Foreign Application Priority Data
Oct. 31, 2008 (FR) ...................................... 08 06079

(51) Int. Cl.
*H03M 3/00* (2006.01)
(52) U.S. Cl.
USPC ........... 341/143; 327/149; 341/144; 341/147; 341/149; 341/153

(58) Field of Classification Search
USPC .................................. 341/120–155; 327/149
See application file for complete search history.

(56) References Cited

U.S. PATENT DOCUMENTS

| | | | |
|---|---|---|---|
| 5,838,272 A | 11/1998 | Steiner et al. | |
| 5,907,299 A * | 5/1999 | Green et al. | 341/143 |
| 5,977,895 A * | 11/1999 | Murota et al. | 341/143 |
| 6,496,128 B2 * | 12/2002 | Wiesbauer et al. | 341/143 |
| 6,839,011 B1 * | 1/2005 | Hong | 341/143 |

(Continued)

FOREIGN PATENT DOCUMENTS
FR  2 907 988 A1  5/2008

OTHER PUBLICATIONS

Peter Kiss, et al.: "Adaptive Digital Correction of Analog Errors in MASH ADC's—Part II: Correction Using Test-Signal Injection," IEEE Transactions on Circuits and Systems II: Express Briefs, IEEE Service Center, New York, NY, US, vol. 47, No. 7, Jul. 1, 2000, XPOI1013253.

*Primary Examiner* — Lam T Mai
(74) *Attorney, Agent, or Firm* — Baker Hostetler LLP

(57) ABSTRACT

In a method for improving resolution and for correcting distortions for a sigma-delta modulator, a modulator converts an analog input signal into a secondary output digital signal sampled at a frequency $f_e$ and coded on $N_B$ bits, a second main output digital signal s'(t) is represented on $N_{MSB}$ bits also being available at the output. At least three processings are applied successively to the outputs, a first processing carrying out a demodulation by a frequency $f_0$ and a decimation of factor N in an independent manner, z second processing carrying out an improvement of the resolution and a third processing carrying out a correction of the distortions. These three processings are carried out after decimation. A sigma-delta modulator implements the method.

12 Claims, 4 Drawing Sheets

(56) References Cited

U.S. PATENT DOCUMENTS

| | | |
|---|---|---|
| 6,998,940 B2 * | 2/2006 | Metzger ........................ 333/187 |
| 7,136,001 B2 * | 11/2006 | Hode et al. .................... 341/143 |
| 7,362,247 B2 * | 4/2008 | Arias et al. .................... 341/120 |
| 7,362,252 B1 * | 4/2008 | Pai ................................ 341/143 |
| 7,965,210 B2 * | 6/2011 | Hode ............................ 341/143 |
| 8,102,290 B2 * | 1/2012 | Hode ............................ 341/143 |
| 2002/0030618 A1 * | 3/2002 | Cusinato et al. .............. 341/143 |
| 2005/0116850 A1 * | 6/2005 | Hezar et al. ................... 341/143 |
| 2005/0237233 A1 * | 10/2005 | Muhammad .................. 341/143 |
| 2005/0275571 A1 | 12/2005 | Bjornsen |

\* cited by examiner

METHOD FOR IMPROVING THE RESOLUTION AND FOR CORRECTING DISTORTIONS IN A SIGMA-DELTA MODULATOR, AND SIGMA-DELTA MODULATOR IMPLEMENTING SAID METHOD

CROSS-REFERENCE TO RELATED APPLICATIONS

This application is a National Stage of International patent application PCT/EP2009/064324, filed on Oct. 29, 2009, which claims priority to foreign French patent application No. FR 08 06079, filed on Oct. 31, 2008, the disclosures of which are incorporated by reference in their entirety.

FIELD OF THE INVENTION

The present invention relates to a method for improving resolution and for correcting distortions for sigma-delta modulator and a sigma-delta modulator implementing the method. It is applied notably to the fields of signal processing, analog-digital conversion and electronics.

BACKGROUND OF THE INVENTION

The conversion of an analog signal into a digital signal has become a conventional operation in contemporary electronic circuits, by virtue of standard commercial hardware components commonly grouped together under the acronym ADC standing for "Analog-Digital Converter". This entails representing a signal e(t) varying in a continuous manner over time and able to take any value in a form s(t) sampled over time. Each sample can take a finite number of possible quantized values and each value is coded on a well determined number of bits. Each bit can take only two possible values, 1 or –1 for example.

Conventional ADCs offer adequate performance in terms of precision at relatively low frequencies of the input signal, of the order of a few tens or indeed hundreds of megahertz. This implies that at these frequencies, the difference between the signal represented digitally at output and the analog input signal is acceptable. But in the microwave frequency domain, when the frequency of the input signal is of the order of a few gigahertz, the dynamic range of conventional ADCs, that is to say their capacity to sample/quantize the input signal both rapidly and precisely, turns out to be markedly inadequate. Firstly, this is due to the inadequate rise time of an internal hardware component of ADCs called the sample-and-hold unit. A sample-and-hold unit has difficulty stabilizing an input signal with a view to quantizing it if its frequency is too high, the duration required for this stabilization then being too large with respect to the sampling period. This introduces errors, that is to say some digital samples may not be representative of the analog signal. Each sample can then be coded only on a reduced number of amplitude values. Intrinsically, this generates an error due to the lack of precision before the quantization of the amplitude of each sample. Consequently, the error inherent in the method of digitization of a conventional ADC at high sampling frequency is the sum of the error described, related to the insufficient speed of the sample-and-hold unit, and of the quantization rounding error which expresses the difference between the signal thus sampled-and-held and its quantized digital representation. This global error is improperly called "quantization noise" since, in practice, the part related to quantization is predominant (at least at low frequency). Thus, at high frequency the difference between the signal represented digitally at output and the analog signal at input becomes non-negligible and the precision of the ADC is no longer adequate. To summarize, the precision of conventional ADCs decreases as the frequency of the analog signal e(t) applied to their input increases. They are therefore not suited to use in applications at very high frequencies demanding good numerical precision, such as radars for example.

A method called sigma-delta modulation makes it possible to improve the precision of an ADC locally around a frequency, optionally around a high frequency. The basic principle is to arbitrarily vary the output digital signal, or to "modulate" it, so as to minimize the error for any spectral component contained in the band of interest (which depends on the use), even if some samples of the output digital signal may seem unrepresentative of the analog input signal. Accordingly, the principle of sigma-delta modulation requires that the signal be greatly over-sampled, which can only be done on a small number of bits. This amounts to increasing the temporal precision by slicing the signal into a large number of samples but, as explained above, at the price of a decrease in the precision in terms of amplitude on account of the increase in the sampling frequency. But by relying on over-sampling, the digital output signal may be modulated so as to minimize the power of this quantization noise in a determined frequency band.

In the frequency or spectral domain, it is commonly said that the Sigma-Delta modulation "shapes" the quantization noise. Indeed, the modulation of the digital output signal, which modulation is suited to the frequency of the input signal, amounts to minimizing the spectral density of the quantization noise around the frequency of the useful signal. In fact, the spectrum of the quantization noise must be "shaped" to conform to an ideal spectrum exhibiting a trough in the vicinity of the frequency of use. Thus, even if globally significant quantization noise is intrinsically generated in Sigma-Delta modulation, this being so whatever the frequency of the signal at input, at least this quantization noise is of low power in the vicinity of the frequency of use.

A Sigma-Delta modulator may be implemented on the basis of an ADC converter feedback-controlled in a conventional manner in a feedback control loop, with a view to attenuating the influence of its quantization noise on its digital output. In this case, a digital-analog converter, called a DAC converter subsequently, makes it possible to reconvert into analog the digital output signal of the ADC converter with a view to subtracting it from the input signal, based on the principle of the closed feedback control loop. An amplifier and a loop filter make it possible to circumvent the drawback of conventional ADCs by associating high frequency and fine resolution.

In addition to the phenomenon of insufficient speed observed at very high frequency of the input signal on the sample-and-hold units of an ADC converter and to which the sigma-delta modulation proposes to afford a response, a phenomenon termed "metastability" arises in respect of other hardware components of these converters, these hardware components being called comparators. Metastability is a known phenomenon of indecision in ADC converters which becomes all the more significant as the sampling frequency increases and therefore as the processing time decreases. This phenomenon has always existed, but with the increase in the operating speed of contemporary digital circuits, it has come to the fore. Because of this phenomenon, which is detailed subsequently, certain bits may not be decided on output from an ADC converter in a sigma-delta modulator: they equal neither –1 nor 1. It is then logic layers situated after the comparators of the ADC which resolve these inconclusive decisions. However, in a sigma-delta modulator, such layers are present both in the loop feedback and in the output path. These layers which are physically different therefore resolve the inconclusive decisions in a totally independent manner, on the one hand for the digital output signal and on the other hand for the digital signal returned to the input of the modulator. Thus nothing guarantees that the indecision resolutions are consistent or uniform between the digital output signal and the digital signal returned to the input. The difference between these two signals must be considered to be an added error.

Since it sends the output signal back to the input, the loop feedback digital-analog DAC converter should exhibit performance in terms of noise and linearity which is at least as good as the performance aimed at for the modulator as a whole since any spurious signal, consistent (spurious spectral lines related to linearity defects) or inconsistent (added noise, coding error), generated in the loop feedback may not be compressed by the loop.

In the subsequent description the least significant bits, also called low-order bits, will subsequently be designated by the acronym LSB standing for "Less Significant Bit". Moreover, the most significant bits, also called high-order bits, will subsequently be designated by the acronym MSB standing for "Most Significant Bit".

The ADC converter decoding logic possibly not being fast enough as regards the LSB bits, it may be preferable to feed back only a certain number of the MSB bits to the loop feedback DAC converter.

In this case, a digital signal whose MSB bits, on the one hand, are supposed to represent the fed back signal for which the quantization noise is shaped by the loop and whose LSB bits, on the other hand, represent a coding of the quantization noise not shaped by the loop, which coding exhibits its own quantization noise, is available at the modulator output. Indeed the ADC converter may be considered to be a linear system which adds noise, that is to say the quantization noise. The output of the ADC converter, on $N_{MSB}+N_{LSB}$ bits in total, comprises $N_{MSB}$ MSB bits which are fed back in the DAC converter and $N_{LSB}$ LSB bits which are not. The $N_{MSB}$ MSB bits therefore carry the useful signal accompanied by the low-resolution quantization noise $b_{MSB}$ shaped by the loop. The $N_{LSB}$ LSB bits provide noise corresponding to the unshaped difference $b_{LSB}-b_{MSB}$ between the high- and low-resolution quantization noise $b_{MSB}$ and $b_{LSB}$.

A possible improvement aimed at limiting the errors related to metastability problems is to re-sample the output of the loop feedback DAC converter with a second ADC so as to have available a second more accurate item of information on the signal actually fed back. In this respect the output of novel ADC will be considered to be the main output of the modulator and that of the loop ADC as the secondary output. The discrepancy between the main signal and the MSB bits of the secondary signal is, with respect to the LSB bits, a complementary measure of the noise not reshaped by the loop. It is therefore possible to consider that the secondary output carries the sum of the main signal, of its shaped quantization noise, of the opposite of the unshaped quantization noise, of the quantization noise $b_{LSB}$ and of the metastability noise. The sum of these last two contributions may be interpreted as the error in estimating the quantization noise not shaped by the system. If the response of the loop is known with sufficient precision it is then possible to take account of the additional item of information carried by the secondary signal (unshaped quantization noise coded with a residual error) so as to numerically improve the resolution of the modulator.

One possibility for thus improving the resolution on the basis of a measurement of the error of the modulator is described in the publication by T. C. Leslie and B. Singh entitled *An improved ΣΔ modulator architecture, IEEE Proc. ISCAS'90*, vat pp. 372-375, May 1990. Other implementations are also described in different ways in the book *Delta-Sigma Data Converters*, IEEE Press, Ed. Norsworthy, Schreier & Temes, Ch 8, pp. 273-275 and in U.S. Pat. No. 5,838,272 entitled Error correcting sigma-delta modulation decoding. These publications show that in a general manner, anywhere in the modulator and in the coding chain, the signal present can be written as a linear combination of the signal and of an error whose coefficients depend on the frequency. It is therefore possible by appropriate filtering and addition to correct the error at output.

When the working frequency is very high, these processings become difficult to carry out on account of their complexity since they are customarily performed before the decimation operation. It is therefore necessary to find solutions making it possible to improve the resolution of sigma-delta modulators operating at high frequency without however overburdening the processing architecture in an ill-considered manner.

SUMMARY OF THE INVENTION

An aim of the invention is notably to alleviate the aforementioned drawbacks.

The subject of the invention is a method for improving resolution and for correcting distortions for a sigma-delta modulator, the modulator converting an analog input signal e(t) into a secondary output digital signal s(t) sampled at a frequency $f_e$ and coded on $N_B=N_{MSB}+N_{LSB}$ bits, of which $N_{MSB}$ are high-order bits MSB and $N_{LSB}$ are low-order bits LSB, the $N_{MSB}$ MSB bits being fed back in the modulator, the signal fed back after digital-analog conversion of the $N_{MSB}$ MSB high-order bits being re-sampled at the frequency $f_e$ so as to generate a second main output digital signal s'(t) represented on $N_{MSB}$ bits, the method comprising at least three processings applied successively to the outputs of the modulator:

a first processing carries out a demodulation by a frequency $f_0$ and a decimation of factor N in an independent manner on the two signals s(t) and s'(t);

a second processing for improving the resolution and a third processing for correcting the distortions are carried out after decimation and are composed of filtering operations whose impulse responses are derived from the estimation of the open-loop analog response $\xi(t)$ of the modulator on the basis of the measurements of the gain of the open loop $\xi_k(t)$ which are carried out after the demodulation and decimation processing.

The temporal response $\xi_k(t)$ of the open loop of the modulator corresponding to a frequency response $\xi_k(f)$ is measured, for example, for various values of additional loop delays by applying as input to the loop feedback DAC converter a series of $2^K \times M$ regularly spaced pulses making it possible, by observing the output ŝ(t) of the modulator after decimation, to perform $2^K$ series of M successive measurements of the impulse response corresponding to $2^K$ different loop delays, these M successive measurements thereafter being averaged to provide $2^K$ measurements of improved precision.

According to another aspect of the invention, noise b(t) of peak amplitude equal to an LSB bit is added during the measurements of the gain of the loop $\xi_k(t)$ upstream of the ADC converter producing the main output digital signal s(t).

Each of the $2^K$ measurements of the $2^K$ responses $\xi_k(t)$ is, for example, filtered by a specific filter of temporal response $J_k(t)$ and frequency response $J_k(f)$ intended to compensate the discrepancy between the loop delay corresponding to this measurement of $\xi_k(t)$ and the loop delay corresponding to the measurement of $\xi_0(t)$.

According to one embodiment, the responses $J_k(t)$ are equal to $[\delta + k \times J/2^K]$ where $\delta$ is a Dirac response and J a finite approximation of a sampling at $f_e/N$ of the derivative of the cardinal sine sin $c[(f_e \cdot t)/N]$.

According to one embodiment, the $2^K$ measurements of the response $\xi_k(t)$ of the loop after averaging and interpolation are weighted by coefficients equal to $$e^{j2\pi k f_0 T_e/2^K}$$

so as to produce an estimation of the open-loop analog response $\xi(f)$ of the modulator.

In one mode of implementation, the second processing carries out a first filtering using an impulse response corresponding to the decimated response $H_0(f)$ of the demodulation/decimation processing, said filtering being applied to the signal $\hat{s}(t)$ resulting from the demodulation/decimation of s(t), and a second filtering using an impulse response corresponding to $\xi_0(f)$, said filtering being applied to the signal $\hat{s}'(t)$ resulting from the demodulation/decimation of s'(t), and a digital signal r(t) of improved resolution is thereafter generated by adding together the signals resulting from the two filtering operations.

According to one aspect of the invention, the third processing carries out a main filtering followed by a complementary filtering applied to the signal r(t), the main filtering having an impulse response corresponding to the inverse of the frequency response $H_0(f) \cdot \xi(f)$ and the complementary filtering having an impulse response corresponding to sin $c[(f+f_0)/f_e]$ in the useful band of the processed signal.

According to another aspect of the invention, the length of the impulse response of the complementary filter of the processing for correcting the distortions is reduced by matching of the spectrum in the remainder of the Nyquist band outside of the useful band of the processed signal.

The subject of the invention is also a sigma-delta modulator comprising at least one conversion loop converting an analog signal e(t) into a main output digital signal s(t), the loop being composed of at least one integrator, a first analog-digital converter ADC generating the secondary output s(t), a loop feedback digital-analog converter DAC, an adder-subtractor and a second analog-digital converter ADC re-sampling the output of the loop feedback converter and generating a main output digital signal s'(t), the modulator being characterized in that it comprises a device for improving resolution and for correcting distortions implementing the method previously described and composed of at least:

- a modulation/decimation module processing the signals s(t) and s'(t) by independent filterings so as to generate at least two output signals $\hat{s}(t)$ and $\hat{s}'(t)$;
- a module for improving the resolution filtering the signals $\hat{s}(t)$ and $\hat{s}'(t)$ so as to produce an output digital signal r(t);
- a module for correcting the distortions filtering the signal r(t) and producing the digital output signal c(t) of the sigma-delta modulator;
- a measurement module for measuring the open-loop digital responses $\xi_k(t)$ of the conversion loop deducing the open-loop analog response $\xi(t)$ of said measurements so as to calibrate the impulse responses of the filters making up the modules for improving the resolution and for correcting the distortions.

In one mode of implementation, the sigma-delta modulator comprises means for compensating the phase off-centerings of the loop of the modulator, a digital command for controlling delay of the loop being deduced from a comparison between an estimation of the open-loop frequency response of the modulator and a reference frequency response.

In another mode of implementation at least one of the modulator processing modules is instantiated in a programmable logic circuit of FPGA type.

BRIEF DESCRIPTION OF THE DRAWINGS

Other characteristics and advantages of the invention will be apparent with the aid of the description which follows given by way of nonlimiting illustration, offered with regard to the appended drawings among which.

DETAILED DESCRIPTION

Figure 1:
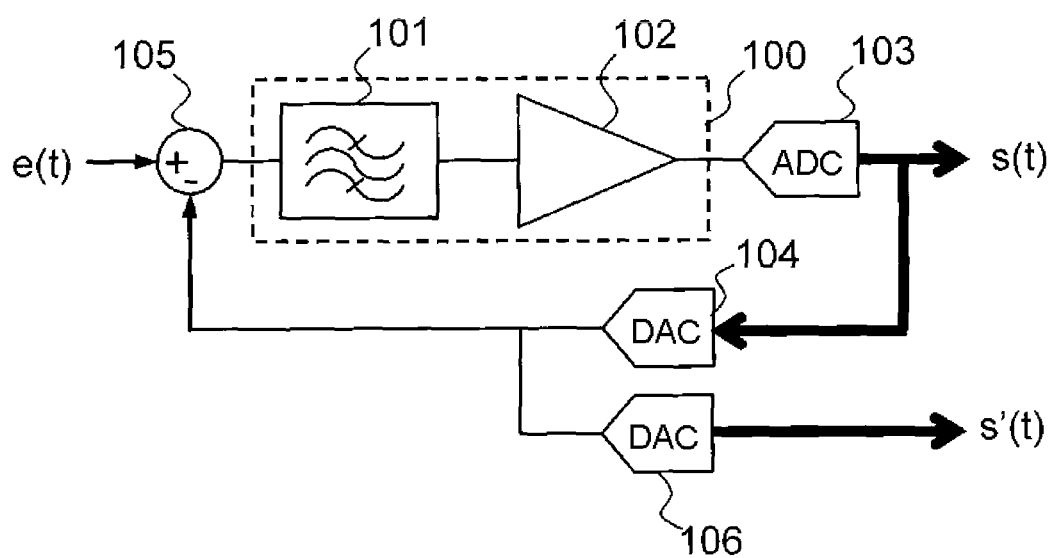
FIG. 1 presents an exemplary sigma-delta modulator in continuous time with re-sampling of the feedback pathway.

FIG. 1 presents an exemplary sigma-delta modulator in continuous time with re-sampling of the feedback pathway.

As explained previously, the role of a sigma-delta modulator in continuous time is two-fold. A first role is to sample and to digitize at high sampling frequency $f_e$ an analog signal e(t) with a low number of bits, that is to say less than the theoretical number required to attain a given signal-to-noise ratio. A second role is to shape the quantization noise so that the spectral density of this noise in the useful band of the signal to be converted is compatible with the signal-to-noise ratio aimed at after decimation. Accordingly, a continuous time bandpass sigma-delta modulator can be regarded as a feedback control loop. The role of an integrator 100 which is itself composed of a bandpass filter 101 and of an amplifier 102 is to integrate and to amplify the error in the useful band of the signal. The loop comprises an ADC converter 103 producing the main output digital signal s(t) of the modulator represented on $N_B$ bits per sample. These $N_B$ bits may be arranged in two groups, i.e. $N_{MSB}$ MSB bits and $N_{LSB}$ LSB bits with $N_B = N_{MSB} + N_{LSB}$. The signal s(t) can therefore be decomposed in the following manner:

$$s(t) = s_{MSB}(t) + s_{LSB}(t) \tag{1}$$

As explained previously, it is beneficial to feed back only the MSB bits, that is to say the digital signal $s_{MSB}(t)$. Accordingly these bits are fed back to a DAC converter 104. An adder-subtractor 105 making it possible to evaluate the difference between the input signal and the coded signal is placed at the input of the modulator. The signal is digital between the output of the ADC converter 103 and the input of the DAC converter 104.

A digital signal s'(t) is generated by re-sampling the output of the loop feedback DAC converter 104 with the aid of a second ADC converter 106 so as to have available a second more accurate item of information on the signal actually fed back. This signal is therefore considered to be the main output of the modulator.

A signal h is in essence a time-varying physical quantity h(t). This signal can also be characterized by its Fourier transform which provides its frequency spectral decomposition. In order to simplify the reading of the expressions in the subsequent description, h(t) will designate the signal described over time and h(f) its Fourier transform.

Figure 2:
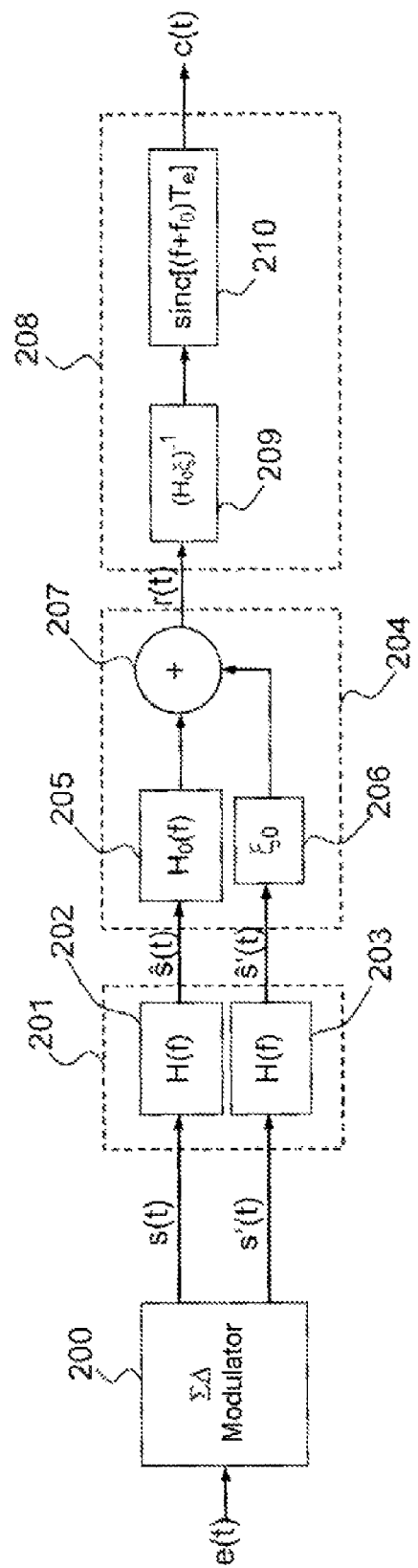
FIG. 2 illustrates the principle allowing the improvement of the resolution and correction of the distortions according to the invention.

FIG. 2 illustrates the principle allowing the improvement of resolution and the correction of distortions according to the invention.

Accordingly, three successive processings are applied to the outputs s(t) and s'(t) of a sigma-delta modulation loop 200 such as described with the aid of FIG. 1. These three processings consist of:

a first processing 201 carrying out a demodulation and a decimation of the outputs of the modulator 200;

a second processing 204 aimed at improving the resolution of the converted signal;

a third processing 208 the purpose of which is to correct the distortions introduced notably by the decimation filter.

The first processing 201 carries out the decimation filter functions, that is to say it eliminates the signal in the bands aliased because of the decimation, as well as the decimation as such. This processing is designated in the subsequent description by the expression "demodulation/decimation processing". The signals s(t) and s'(t) each undergo an identical filtering and decimation processing 202, 203. The impulse response of the two processings corresponding to a frequency response H(f) is therefore applied to the signals s(t) and s'(t) so as to generate respectively two outputs ŝ(t) and ŝ'(t), ŝ(t) being expressible in the following manner:

$$\hat{s}(t) = \hat{s}_{MSB}(t) + \hat{s}_{LSB}(t) \quad (2)$$

The second processing 204 improves the resolution of the main output of the modulator after filtering and decimation ŝ'(t) by using the item of information regarding the signal fed back by the modulator after filtering and decimation ŝ'(t). This processing leads to the signal r(t) defined according to the following expression:

$$r(t) = \xi_0(f)\hat{s}'(f) + H_0(f)\hat{s}(f) \quad (3)$$

$\xi_0(f)$ being an estimation of the open-loop gain of the modulator, said gain being measured between the input of the loop feedback DAC converter and the output of the loop ADC converter producing the secondary output signal s(t). $H_0(f)$ represents the restriction to the decimated band of the response H(f) of the demodulation/decimation filter.

The second processing 204 therefore consists of a filtering of ŝ(t) by $H_0(f)$ 205 carried out in parallel with a filtering of ŝ'(t) by $\xi_0(f)$ 206. The output signal r(t) resulting from this second processing is the sum 207 of the results of these two filtering operations.

In an approximate manner, and by neglecting the effects of the spectrum aliasing and the response of the loop feedback DAC, $\xi_0(f)$ is the restriction of G(f)·H(f) to the decimated band where G(f) is the gain of the open loop of the modulator. Still in an approximate manner, it is known that the gain of the closed loop is:

$$\frac{G(f)}{1+G(f)} \text{ on the signal } e \quad (4)$$

$$\frac{1}{1+G(f)} \text{ on the noise } b \quad (5)$$

As indicated above, the signal of the secondary output equals:

$$S = s' - b + \text{errors} \quad (6)$$

It is easily deduced from this that with the processing:

$$G \cdot s' + s = G \cdot e + b - b + \text{errors} = G \cdot e + \text{errors} \quad (7)$$

and without the processing, in the useful band where G is large:

$$Gs' = G^2 e/(1+G) + Gb/(1+G) \approx Ge + b \quad (8)$$

It is apparent that the processing has substituted the errors in estimating the quantization noise for the quantization noise itself, this being, basically, an improvement of the resolution which is all the better, in principle, the smaller the error, that is to say the larger the number of LSBs.

The aim of the third processing 208 is to correct the distortions introduced notably by the decimation filter. The signal r(t) resulting from the previous processing 204 is processed so as to generate the output signal c(t) expressed in the following manner:

$$c(t) = [H_0(f)\xi(f)]^{-1} \cdot \text{sin } c[(f+f_0)T_e] \cdot r(t) \quad (9)$$

the function sin c ( ) being defined by:

$$\text{sinc}(z) = \frac{\sin(\pi z)}{\pi z} \quad (10)$$

and ξ(f) being the open-loop analog response of the modulator 200, that is to say the response between its (analog) input and the (analog) output of the DAC. This response not being, in practice, directly measured since only its aliasing related to the sampling is accessible via the data of the loop ADC, it is calculated on the basis of a series of $2^K$ measurements using the following expression, which constitutes, for each frequency, an inverse discrete Fourier transformation (IFFT):

$$\xi(f) = \frac{1}{2^K} \sum_{k=0}^{2^K-1} e^{jk2\pi f_0 T_e/2^K} \xi_k(f) e^{jk2\pi f T_e/2^K} \quad (11)$$

where $\xi_k(f)$ represents a measurement of the gain of the open loop for an additional loop delay of $k \times T_e/2^K$, which measurement is available after the demodulation and decimation processing 201. According to relation (9) this third processing is therefore composed of a filtering by the inverse of $H_0(f)\xi(f)$ 209 followed by the application of the function sin c[(f+f_0)·T_e] 210.

The improvement in the resolution through the calculation using data, of whatever origin, from measurement of the quantization noise or the error made, depends very greatly on the precision with which the response of the loop is known. For the processing for correcting the coding errors (quantization or other errors), it is therefore important to use known or easily measurable filter responses that can be synthesized with sufficient precision. This is all the more true when dealing with continuous time modulators which mix continuous time responses and sampled responses. As indicated by relations (3) and (9), the present invention has the advantage of making it possible to use only such functions. Moreover, the steps of improving resolution 204 and of correcting distortions 208 operate after decimation 201, thereby permitting an implementation of the method with reasonable complexity when the working frequency of the modulator is high. Moreover, all of these functions are accessible or calculable in time without any need to revert to frequency.

Figure 3:
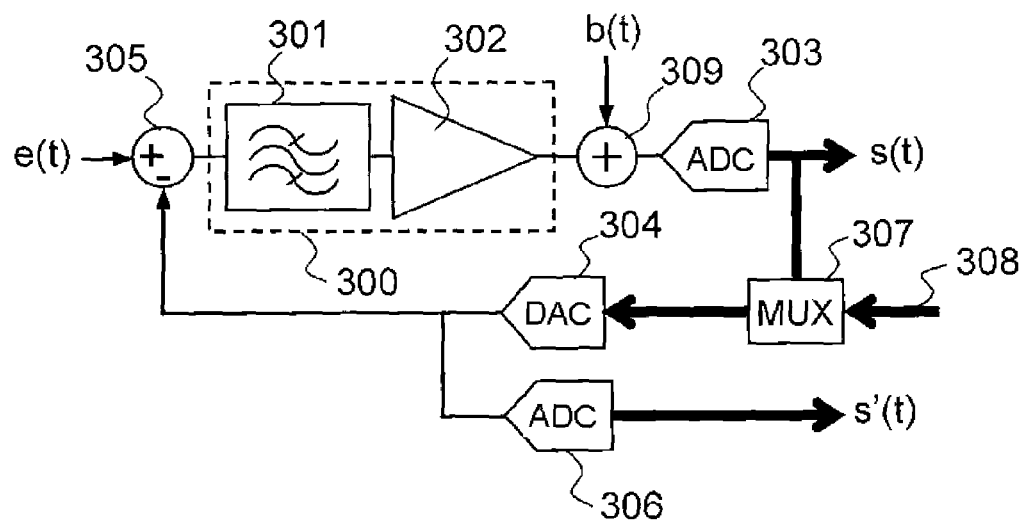
FIG. 3 presents a way of measuring the open-loop response of a sigma delta modulator.

FIG. 3 presents a way of measuring the open-loop response of a sigma-delta modulator.

The determination of the filters presented in FIG. 2 requires that the open-loop response of the sigma-delta modulator be known. Accordingly, it must therefore be measured. The modulator conversion loop is composed notably of an integrator 300 itself composed of a bandpass filter 301 and of an amplifier 302. The loop also comprises an ADC converter 303 producing the modulator's main output digital signal s(t). The MSB bits of s(t) are fed back to a DAC converter 304. An adder-subtractor 305 making it possible to evaluate the difference between the input signal and the coded signal is placed at the input of the modulator. The secondary output digital signal s'(t) is generated by re-sampling the output of the loop feedback DAC converter 304 with the aid of a second ADC converter 306.

Basically the opening of the loop is performed just after the loop output, that is to say at the input of the loop feedback DAC converter 304. The measurement of this response can be achieved either directly by opening the loop, or in an indirect manner, keeping the loop closed. In both cases this makes it necessary to inject a signal 308 at the level of the input of the DAC converter 304. Accordingly it is necessary to place in front of the DAC, for example, a static multiplexer 307 for a direct measurement or else a summator for an indirect measurement. The static multiplexer 307 has only a very limited impact on the latency of the loop. This is why the option of open-loop direct measurement is customarily chosen.

In practice it is not the frequency response to be achieved which is important but its impulse response since the filtering is implemented by convolution in the time domain. In theory, having regard to the nature of the loop filtering, the response of the open loop is a response of infinite duration but its decay is such that it is possible to truncate it and to liken it to a response of finite duration. This response is easily measured by injecting a pulse onto the DAC converter 304 and by gathering the information available at output after the optional demodulation/decimation steps.

As the output of the ADC converter 304 is quantized on a number of bits which is by definition fairly low, the precision of such a measurement is not good. It is then possible to redo the same measurement at regular intervals, the intervals being greater than the duration of the truncated response, and to compute an average. For this average to be effective, it is necessary for the measurements to be different. Accordingly, slight noise b(t) is added 309 upstream of ADC converter 303 of the loop, for example. This noise b(t) has, for example, a flat histogram and a peak amplitude equal to 1 LSB bit. The number of measurements to be averaged depends on the number of bits available for the measurement. For example, for 6 bits, 16 to 32 measurements may suit.

This measurement provides directly the sought-after coefficients of the transverse filter approximating the response $\xi_0(f)$ of the open loop after demodulation, filtering and decimation at the sampling frequency of the output of the demodulation/decimation processing.

Figure 4:
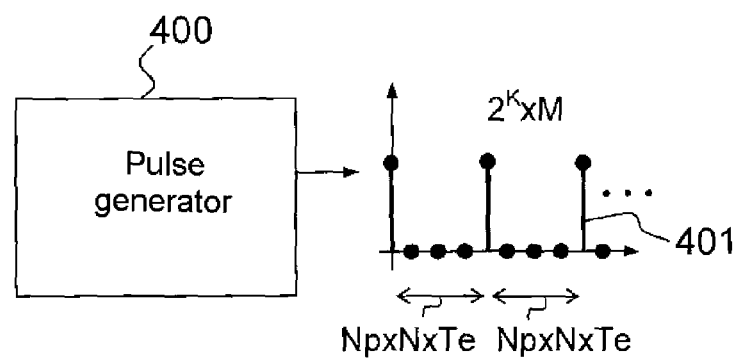
FIG. 4 presents an exemplary pulse generator that can be used for the measurement of the gain of the open loop of the modulator.

FIG. 4 presents an exemplary pulse generator 400 that can be used for measuring the gain of the open loop of the modulator. The latter makes it possible to generate $2^K$ series of M pulses making it possible to perform $2^K$ series of M successive measurements of the open-loop impulse response of the modulator, which are averaged so as to obtain $2^K$ measurements $\xi_k(t)$ for $0 \leq k \leq 2^K - 1$ corresponding to $2^K$ different loop delays. These pulses are directed to the loop feedback DAC converter. Each pulse 401 is spaced from its neighboring pulses, for example, by $N_p \times N$ sampling clock periods, N being the rank of the decimation and $N_p$ the maximum number of samples of the impulse response to be measured. The spacing between the pulses must be chosen to be large enough to isolate the successive measurements of the response of the loop intended to be averaged thereafter.

Figure 5:
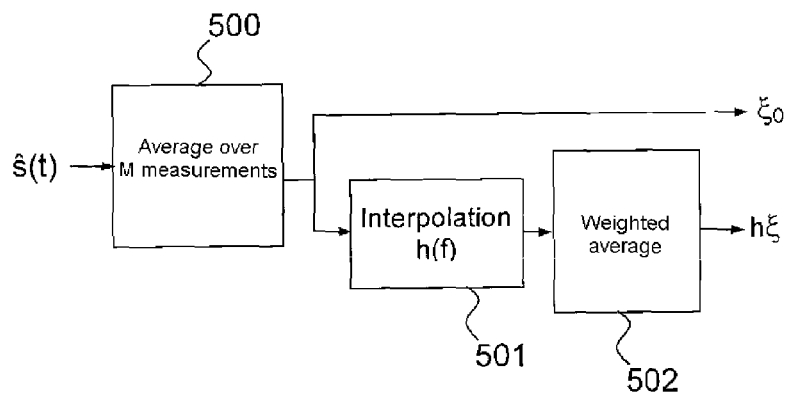
FIG. 5 presents a scheme making it possible to evaluate the gain of the open loop of the modulator and to estimate the analog response of the loop.

FIG. 5 presents a scheme making it possible to evaluate the gain $\xi_k(f)$ (for $0 \leq k \leq 2^K - 1$) of the open loop of the modulator and to estimate the analog response $\xi(f)$, the latter response having to be known so as to improve the resolution and to correct the distortions at the output of the modulator when the method according to the invention is used.

The analog response $\xi(f)$ is obtained by virtue of a weighted mean of the $2^K$ measurements $\xi_k(f)$ performed with delays in arithmetic progression from $\theta$ to $\theta+(1-2^{-K})T_e$. Like the measurement of $\xi_0(f)$ described previously, these measurements of $\xi_k(f)$ are naturally obtained in the time domain at a slower sampling rate than the clock frequency $f_e = 1/T_e$ on account of the decimation processing. However, in the weighted mean, the weighting of $\xi_k(f)$ by $$e^{j2\pi k f T_e 2^K}$$

corresponds, in the time domain, to shifting $\xi_k(t)$ by $-k \cdot T_e/2^K$, that is to say by a much finer value than the sampling period. To remain in the time domain it would therefore be necessary to perform an interpolation to restore the useful value, this interpolation filter having to be sampled at the frequency $f_{ech} = 2^K \times f_e$ where $f_e$ is the sampling frequency of the loop ADC. This would consume a lot of calculation resources while retaining, at the end of the day, only decimated information. It is therefore necessary to transform this processing part to render it easier to carry out.

To circumvent the problem and avoid this over-sampling, an original solution consists in rewriting the formalism describing the over-sampling and then the decimation of the responses $\xi_k$ whose spectrum has been transposed in the vicinity of the continuous by the demodulation operation.

The interpolation of the signals $\xi_k$ from $f_e/N$ to $2^K \cdot f_e$ can be decomposed into two distinct interpolation operations:

- a first interpolation by N followed by a second interpolation by $2^K$, the whole having a temporal response denoted by I. In what follows, the time will be counted in multiples of $1/f_e$ where $f_e$ is the sampling frequency of the loop ADC and the notation $X_k$ defined by $X_k = I \otimes \xi_k$ is used.
- a second interpolation takes place on a sampled signal whose rate is N times greater than the Nyquist rate.

The second interpolation may be approximated, without appreciable error, by a linear interpolation:

$$Y_k(n) \approx X_k(n+k/2^K) \approx X_k(n) + k \times [X_k(n) - X_k(n-1)]/2^K \quad (12)$$

that is to say:

$$Y_k(n) \approx X_k(n) + k \times X'_k(n)/2^K = [I \otimes \xi_k](n) + k \times [I' \otimes \xi_k](n)/2^K \quad (13)$$

i.e. after convolution by the impulse response H of the decimation/demodulation post-processing:

$$H \otimes Y_k \approx H \otimes [I \otimes \xi_k] + k \times H \otimes [I' \otimes \xi_k]/2^K \quad (14)$$

that is to say:

$$H \otimes Y_k \approx [I \otimes H \otimes \xi_k] + k \times [I' \otimes H \otimes \xi_k]/2^K \quad (15)$$

However, $\xi_k$ is a response sub-sampled by the decimation. $H_0$ corresponding to the restriction of H to the decimated band, that is to say to a sub-sampling of H, we therefore have ultimately, in the time domain, for the various frequency terms corresponding to the Fourier sum of the IFFT of relation (11):

$$H \otimes Y_k \approx Z_k = H_0 \otimes [\xi_k + k \times J \otimes \xi_k/2^K] \quad (16)$$

where J represents the sub-sampling of I' by $N \times 2^K$.

The response $H_0(t) \otimes \xi(t)$ of spectrum $H_0(f)\xi(f)$ will ultimately be obtained by computing a mean weighted by $$e^{j2\pi k f_0 T_e/2^K}$$

of the $2^K$ responses $Z_k$. It is thus possible to avoid the oversampling of the calculations.

The interpolation filter I is by definition a cardinal sine whose response is, however, infinite:

$$I = \sin c(f/f_{ech}) = \sin c(f/f_e/2^K) \quad (17)$$

In practice, it is then necessary to limit the duration of its derivative and to weight it to limit the effects of the truncation. The duration of J is, for example, adjusted so as not to degrade the result in the band.

In order to synthesize the response $H_0(f)\xi(f)$, the following operations may be conducted:
- a series of $2^K \times M$ pulses, as illustrated with FIG. 4, is applied as input to the loop feedback DAC converter of the modulator allowing the conducting of $2^K$ series of M successive measurements of impulse responses of $N_p$ points. Each of the series of measurements corresponds to a different value of loop delay $\theta + k \times T_e/2^K$ ($0 \leq k \leq 2^K - 1$) where $\theta$ is the nominal loop delay;
- these series of M measurements are averaged 500 to provide $2^K$ measurements of $\xi_k(t)$ with improved precision; consequently, the response $\xi_0(t)$ is available and usable subsequent to this averaging operation;
- the $2^K$ measurements of $\xi_k(t)$ are thereafter filtered by a filter of response $J_k$ equal to $J_k = [\delta + k \times J/2^K]$ where $\delta$ is a Dirac response, zero everywhere except at the center of the response, and J a finite approximation of a sampling at $f_e/N$ of the derivative of the cardinal sine $\sin c[(f_e \cdot t)/N]$. A mean weighted by $$e^{j2\pi k f_0 T_e/2^K} 502$$

is conducted on the $2^K$ responses thus filtered.

Figure 6:
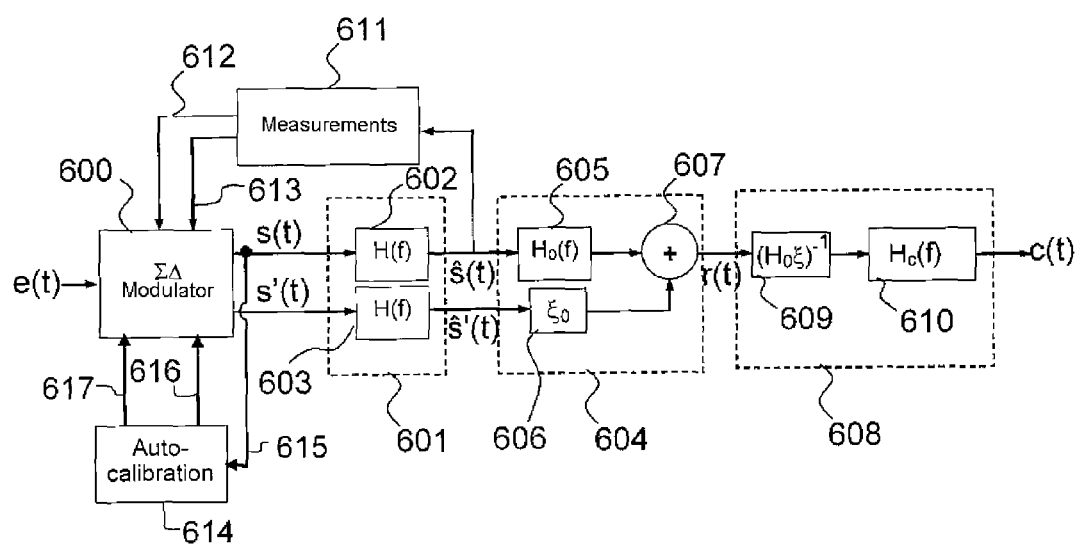
FIG. 6 gives an exemplary sigma-delta modulator comprising a device for improving resolution and for correcting distortions.

FIG. 6 gives an exemplary sigma-delta modulator comprising a device for improving resolution and for correcting distortions. The modulator comprises a sigma-delta conversion loop and means for improving the resolution and correcting the distortions at the output of the modulator. The figure reuses the elements described previously with the aid of FIG. 2 while depicting a so-called auto-calibration module 614 whose role is notably to measure the modulator's open-loop response. This module can also be responsible for the automatic adjustment of the loop so as to compensate the phase and amplitude off-centerings of the loop.

The device therefore comprises a conversion loop carrying out the sigma-delta modulation 600 taking as input an analog signal e(t) and generating two outputs s(t) and s'(t). The digital signal s(t) is the secondary output of the sigma-delta modulator. Said signal is a digital signal represented on $N = N_{MSB} + N_{LSB}$ bits per sample. The main output digital signal s(t) represented on $N_{MSB}$ bits is generated subsequent to the re-sampling of the output of the loop feedback DAC converter.

The device furthermore comprises a first processing module 601 carrying out the decimation/demodulation operations by applying the same filtering operation H(f) 602, 603 to the output signals s(t) and s'(t) of the modulator producing respectively the signals ŝ(t) and ŝ'(t).

To operate correctly, the second 604 and third 608 processing modules must have at their disposal an estimation of the response of the loop of the sigma delta modulator taking account of the decimation 601. A measurement module 611 is notably responsible for this estimation. In order to undertake it, the measurement module 611 comprises, for example, a pulse generator such as described previously. The resulting pulse train is input 613 to the feedback DAC converter of the conversion loop 600 with the aid, for example, of a multiplexer. The resulting signal ŝ(t) available as output from the decimation/demodulation module 601 is used as input to the measurement module 611. The responses $\xi_0(t)$ and $H_0(t) \otimes \xi(t)$ are estimated, for example, by applying the scheme explained previously with FIG. 5.

An auto-calibration module 614 can also make it possible to compensate the phase and amplitude off-centerings of the conversion loop 600 of the modulator. The open-loop frequency response is estimated, for example, with the aid of a digital network analyzer injecting a stimuli signal 616 into the conversion loop 600 so as thereafter to analyze the signal s(t) 615 resulting from said stimuli. The frequency response thus estimated is thereafter compared with a reference response. Subsequent to this comparison, commands 617 for controlling the loop of the modulator are generated. For the correction of the phase off-centerings, a loop delay command makes it possible, for example, to adjust the relative phase between the clock signals of the ADC and DAC converters of the loop. The results $\xi_k(t)$ of the measurement module 614 may notably be used so as to increment the loop delay command. The amplitude off-centering of the loop may thus be corrected by applying, for example, a drive voltage to the amplifier, this voltage being proportional to the amplitude error to be compensated. In this case, an amplifier with variable gain is necessary for the sigma-delta modulator.

A second processing module 604 taking as input the signals ŝ(t) and ŝ'(t) is aimed at improving the resolution of the output of the modulator after decimation. Accordingly, two filterings of temporal responses corresponding to $H_0(f)$ 605 and $\xi_0(f)$ 606 are applied respectively to the signals ŝ(t) and ŝ'(t). The signals resulting from these two filtering operations are thereafter added together 607 so as to generate the output signal r(t) of the module.

The aim of a third processing module 608 taking the signal r(t) as input is to correct the distortions. The signal r(t) is processed successively by two filters: a main filter 609 of frequency response $[H_0(f) \cdot \xi(f)]^{-1}$ and a complementary filter 610 of response $H_c(f)$ leading to the output signal c(t) of the device. The response of the complementary filter 610 has a temporal response coinciding with $\sin c[(f+f_0)T_e]$ in the useful band and exhibiting a matching in the remainder of the Nyquist band, intended to reduce the length of its temporal response.

The invention claimed is:

1. A method for improving resolution and for correcting distortions for a sigma-delta modulator, the modulator converting an analog input signal e(t) into an output digital signal s(t) sampled at a frequency $f_e$ and coded on $N_B = N_{MSB} + N_{LSB}$ bits, of which $N_{MSB}$ are high-order bits MSB and $N_{LSB}$ are low-order bits LSB, the $N_{MSB}$ MSB bits being fed back in the modulator, the signal fed back after digital-analog conversion of the $N_{MSB}$ MSB bits being re-sampled at the frequency $f_e$ to generate a second output digital signal s'(t) represented on $N_{MSB}$ bits, the method comprising applying, at the output of the modulator:

a first processing which carries out a demodulation by a frequency $f_0$ and a decimation of factor N independently on the signals s(t) and s'(t);

a second processing for improving the resolution of a result of the first processing; and a third processing for correcting distortions of a result of the second processing, wherein the second and the third processings comprise filtering operations having impulse responses which are derived from an estimation $\xi_0(t)$ of an open-loop analog response $\xi(t)$ of the modulator based on measurements of an open-loop impulse response $\xi_k(t)$, said measurements having been carried out on output from the first processing.

2. The method as claimed in claim 1, wherein the open-loop impulse response $\xi_k(t)$ of the open loop of the modulator corresponding to a frequency response $\xi_k(f)$ is measured for various values of additional loop delays by applying as input to a loop feedback digital-analog converter, a series of $2^K \times M$ regularly spaced pulses by observing an output signal $\hat{S}(t)$ from the first processing, said output signal $\hat{S}(t)$ resulting from the decimation, to perform $2^K$ series of M successive measurements of the impulse response corresponding to $2^K$ different loop delays, the M successive measurements being averaged to provide $2^K$ measurements of improved precision.

3. The method as claimed in claim 2, wherein noise b(t) of peak amplitude equal to an LSB bit is added during measurements of gain of the loop $\xi_k(t)$ upstream of an analog-digital converter producing the output digital signal s(t).

4. The method as claimed in claim 2, wherein each of the $2^K$ measurements of the $2^K$ responses $\xi_k(t)$ is filtered by a specific filter of temporal response $J_k(t)$ and frequency response $J_k(f)$ intended to compensate for discrepancy between the loop delay corresponding to the measurement of $\xi_k(t)$ and the loop delay corresponding to the measurement of $\xi_0(t)$.

5. The method as claimed in claim 4, wherein the responses $J_k(t)$ are equal to $[\xi + k \times J/2^K]$ where $\xi$ is a Dirac response and J a finite approximation of a sampling at $f_e/N$ of the derivative of a cardinal sine $\sin c[(f_e \cdot t)/N]$.

6. The method as claimed in claim 4, wherein the $2^K$ measurements of the response $\xi_k(t)$ of the loop after averaging and interpolation are weighted by coefficients equal to $$e^{j2\pi k f_0 T_e/2^K}$$

to produce an estimation of the open-loop analog frequency response $\xi(f)$ of the modulator.

7. The method as claimed in claim 1, wherein the second processing comprises:

a first filtering using an impulse response corresponding to a decimated response $H_0(f)$ of the demodulation/decimation demodulation and decimation processing, said first filtering being applied to an output signal $\hat{S}(t)$ resulting from the demodulation and decimation of s(t), and a second filtering using an impulse response equal to $\xi_0(t)$, said second filtering being applied to an output signal $\hat{S}'(t)$ resulting from the demodulation and decimation of s'(t), wherein a digital signal r(t) of improved resolution is generated by adding signals resulting from the first and second filtering.

8. The method as claimed in claim 7 wherein the third processing comprises a main filter followed by a complementary filter applied to the signal r(t), the main filter having an impulse response corresponding to the inverse of the frequency response $H_0(f) \cdot \xi(f)$ and the complementary filter having an impulse response corresponding to $\sin c[(f+f_0)/f_e]$ in a useful band of the signal r(t).

9. The method as claimed in claim 8, wherein length of the impulse response of the complementary filter of the processing for correcting the distortions is reduced by matching of a spectrum in a remainder of a Nyquist band outside of the useful band of the signal r(t).

10. A sigma-delta modulator comprising at least one conversion loop converting an analog signal e(t) into a output digital signal s(t), the loop comprising at least one integrator, a first analog-digital converter generating the output signal s(t), a loop feedback digital-analog converter, an adder-subtractor, and a second analog-digital converter re-sampling the output of the loop feedback converter and generating a main output digital signal s'(t), the modulator comprising a device for improving resolution and for correcting distortions, the device being configured to perform:

a first processing which carries out a demodulation by a frequency $f_0$ and a decimation of factor N independently on the signals s(t) and s'(t);

a second processing for improving the resolution of a result of the first processing; and a third processing for correcting distortions of a result of the second processing, wherein the device is configured to perform second and the third processings by performing filtering operations having impulse responses which are derived from an estimation $\xi_0(t)$ of an open-loop analog response $\xi(t)$ of the modulator based on measurements of an open-loop impulse response $\xi_k(t)$, said measurements having been carried out on output from the first processing, wherein the device further comprises:

a modulation/decimation module processing the signals s(t) and s'(t) by independent filtering to generate at least two output signals $\hat{S}(t)$ and $\hat{S}'(t)$;

a module for improving the resolution by filtering the signals $\hat{S}(t)$ and $\hat{S}'(t)$ to produce an output digital signal r(t);

a module for correcting the distortions by filtering the signal r(t) and producing an output digital signal c(t) of the sigma-delta modulator; and a module for measuring the open-loop impulse response $\xi_k(t)$ of the conversion loop by deducing the open-loop analog response $\xi(t)$ of said measurements to calibrate the impulse responses of the filters included in the modules for improving the resolution and for correcting the distortions.

11. The sigma-delta modulator as claimed in claim 10, further comprising means for compensating for phase off-centerings of the loop of the modulator, a digital command for controlling delay of the loop being deduced from a comparison between an estimation of the open-loop frequency response of the modulator and a reference frequency response.

12. The sigma-delta modulator as claimed in claim 10, wherein at least one of the modules is a field programmable gate array logic circuit.

* * * * *